(12) United States Patent
Siddiqui et al.

(10) Patent No.: US 10,629,428 B2
(45) Date of Patent: Apr. 21, 2020

(54) METAL INSULATOR METAL CAPACITOR DEVICES

(71) Applicant: GLOBALFOUNDRIES INC., Grand Cayman (KY)

(72) Inventors: Shariq Siddiqui, Delmar, NY (US); Han You, Cohoes, NY (US); Xunyuan Zhang, Albany, NY (US); Rohit Galatage, Clifton Park, NY (US); Roger A. Quon, Rhinebeck, NY (US); Christopher J. Penny, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/916,594

(22) Filed: Mar. 9, 2018

(65) Prior Publication Data

US 2019/0279860 A1 Sep. 12, 2019

(51) Int. Cl.
*H01L 27/108* (2006.01)
*H01L 29/92* (2006.01)
*H01G 4/08* (2006.01)
*H01L 21/02* (2006.01)
*H01L 21/8242* (2006.01)

(Continued)

(52) U.S. Cl.
CPC ...... *H01L 21/022* (2013.01); *C23C 16/45527* (2013.01); *H01L 21/02181* (2013.01); *H01L 21/02189* (2013.01); *H01L 21/02332* (2013.01); *H01L 21/02337* (2013.01); *H01L 21/02348* (2013.01); *H01L 21/3105* (2013.01); *H01L 27/0629* (2013.01); *H01L 28/60* (2013.01); *H01L 21/76816* (2013.01)

(58) Field of Classification Search
CPC .............. C23C 16/0236; C23C 16/405; C23C 16/45525; C23C 16/45529; C23C 16/56; C23C 16/403; H01L 21/022; H01L 21/3142; H01L 21/31641; H01L 28/40; H01L 21/0228; H01L 21/02178; H01L 21/02189; H01L 21/31616; H01L 27/10852
See application file for complete search history.

(56) References Cited

U.S. PATENT DOCUMENTS

2005/0012089 A1 1/2005 Senzaki et al.
2005/0048795 A1* 3/2005 Ko .................. H01L 21/312
                                                           438/778

(Continued)

FOREIGN PATENT DOCUMENTS

TW  200404911  4/2004
TW  201246462  11/2012

OTHER PUBLICATIONS

Taiwanese Office Action dated Jul. 15, 2019 in related TW Application No. 108104071, 10 pages.

*Primary Examiner* — Brian Turner
(74) *Attorney, Agent, or Firm* — Anthony Canale; Andrew M. Calderon; Roberts Calderon Safran & Cole, P.C.

(57) ABSTRACT

The present disclosure generally relates to semiconductor structures and, more particularly, to metal insulator metal capacitor devices and methods of manufacture. The method includes: depositing a bottom plate; depositing a dielectric film over the bottom plate; exposing the dielectric film to a gas; curing the dielectric film; and depositing a top plate over the dielectric film.

14 Claims, 3 Drawing Sheets

(51) Int. Cl.
  *H01L 21/8234* (2006.01)
  *H01L 49/02* (2006.01)
  *C23C 16/455* (2006.01)
  *H01L 27/06* (2006.01)
  *H01L 21/3105* (2006.01)
  *H01L 21/768* (2006.01)

(56) References Cited

U.S. PATENT DOCUMENTS

| | | | |
|---|---|---|---|
| 2005/0239297 A1* | 10/2005 | Senzaki | C23C 16/403 438/785 |
| 2006/0097305 A1* | 5/2006 | Lee | C23C 16/0236 257/310 |
| 2006/0180844 A1* | 8/2006 | Agarwal | H01L 21/02183 257/310 |
| 2007/0042130 A1 | 2/2007 | Ghanayem | |
| 2007/0048929 A1* | 3/2007 | Park | H01L 29/513 438/238 |
| 2007/0102742 A1* | 5/2007 | Kil | H01L 21/02178 257/295 |
| 2007/0152256 A1* | 7/2007 | Iizuka | C23C 16/405 257/306 |
| 2009/0242957 A1* | 10/2009 | Ma | H01L 21/28273 257/316 |
| 2010/0315760 A1* | 12/2010 | Krishnan | H01G 4/10 361/313 |
| 2011/0024875 A1* | 2/2011 | Takebayashi | C23C 16/40 257/532 |
| 2012/0040162 A1* | 2/2012 | Huang | H01L 21/02186 428/220 |
| 2012/0187534 A1 | 7/2012 | Xie et al. | |
| 2012/0264284 A1* | 10/2012 | Wang | H01L 21/28088 438/592 |
| 2012/0320494 A1* | 12/2012 | Krishnan | H01G 4/10 361/313 |
| 2012/0322220 A1* | 12/2012 | Chen | H01L 28/40 438/381 |
| 2013/0071987 A1* | 3/2013 | Chen | H01L 27/1085 438/396 |

* cited by examiner

METAL INSULATOR METAL CAPACITOR DEVICES

FIELD OF THE INVENTION

The present disclosure generally relates to semiconductor structures and, more particularly, to metal insulator metal capacitor devices and methods of manufacture.

BACKGROUND

Metal Insulator Metal Capacitor (MIMCAP) devices are gaining interest for various applications, including RF and mixed signal devices, amongst other examples. In certain applications, a high capacitance MIMCAP is needed to reduce voltage fluctuation for decoupling purposes, thereby enhancing speed and reliability of the device, amongst other benefits. However, dielectric breakdown of the insulator layer can occur with high capacitance, resulting in leakage.

SUMMARY

In an aspect of the disclosure, a method comprises: depositing a bottom plate; depositing a dielectric film over the bottom plate; exposing the dielectric film to a gas; curing the dielectric film; and depositing a top plate over the dielectric film.

In an aspect of the disclosure, a method comprises: depositing a first high-k dielectric layer over a bottom plate; exposing the first high-k dielectric layer to a $NH_3$ or $O_3$ gas; curing the first high-k dielectric layer with UV radiation; depositing at least one additional high-k dielectric layer over the first high-k dielectric layer in either a stacked or laminate structure; exposing and curing the least one additional high-k dielectric layer; and depositing a top plate over the least one additional high-k dielectric layer.

In an aspect of the disclosure, a structure comprises: a bottom plate; a nitrogen infused dielectric film over the bottom plate; and a top plate over the nitrogen infused dielectric film.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to metal insulator metal capacitor (MIMCAP) devices and methods of manufacture. The processes and structures provided herein improve MIMCAP capacitance and reduce leakage. Specifically, the processes and structures provided herein allow for a dielectric film of a MIMCAP device to have an increased capacitance, thereby preventing dielectric breakdown to reduce leakage in high capacitance applications.

In embodiments, a surface of the dielectric film is modified to increase capacitance. Specifically, the dielectric film is modified with a gas and then cured with ultra-violet (UV) radiation. In this way, the modification of the dielectric film anneals the dielectric film with a thermal budget compatible with back end of line (BEOL) temperatures. This results in the dielectric film having an increased dielectric constant, resulting in an increased capacitance for the prevention of dielectric breakdown, thereby reducing leakage in high capacitance applications.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
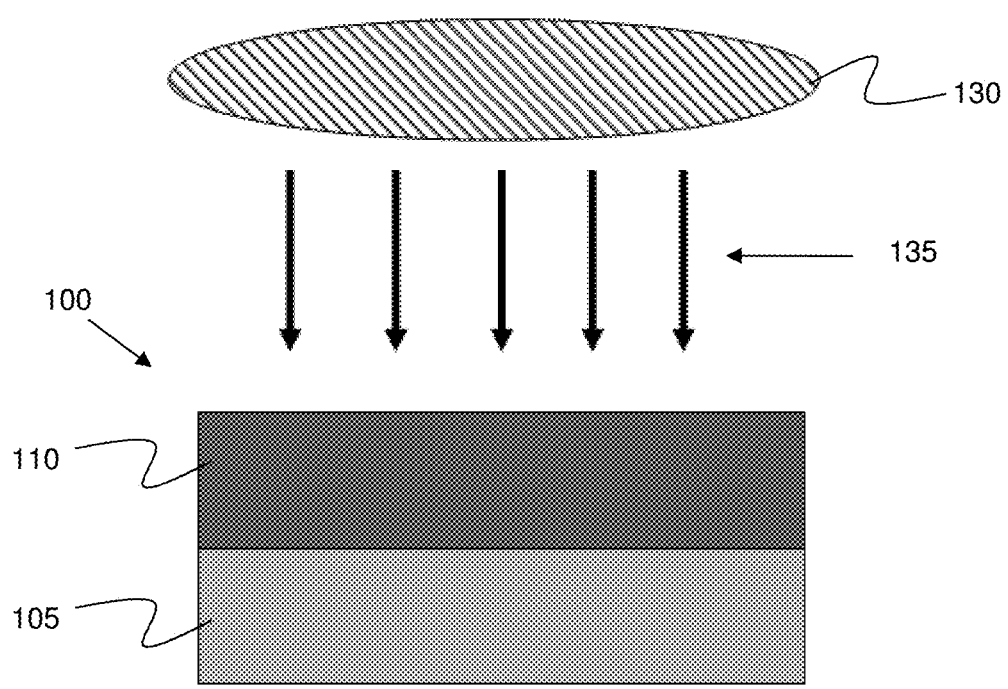
FIG. 1 shows an incoming structure, amongst other features, and respective fabrication processes in accordance with aspects of the present disclosure.

FIG. 1 shows an incoming structure and respective fabrication processes in accordance with aspects of the present disclosure. More specifically, FIG. 1 shows a metal insulator metal capacitor (MIMCAP) device 100. The MIMCAP device 100 comprises a metal plate 105, which can be deposited by conventional deposition processes, e.g., chemical vapor deposition (CVD) or physical vapor deposition (PVD) processes, for example. In this way, there is a deposition of a bottom plate, i.e., the metal plate 105. In embodiments, the metal plate 105 can be composed of any suitable conductive metal, e.g., TiN, amongst other examples.

Figure 2A:
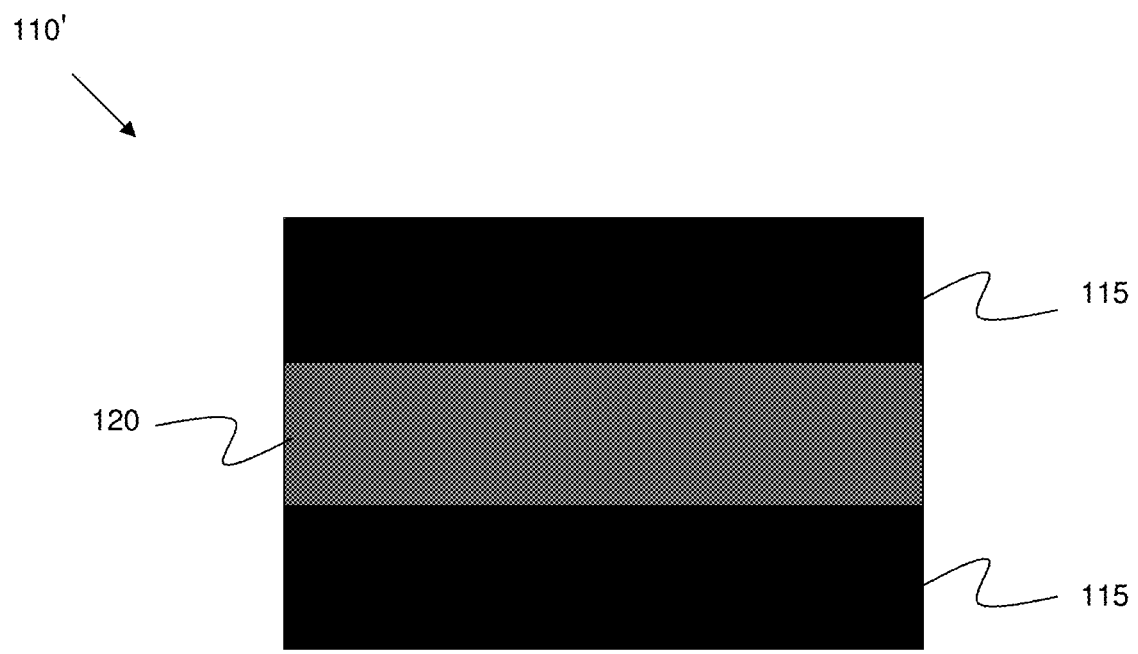
FIGS. 2A and 2B show various embodiments of dielectric films, amongst other features, and respective fabrication processes in accordance with aspects of the present disclosure.
Figure 2B:
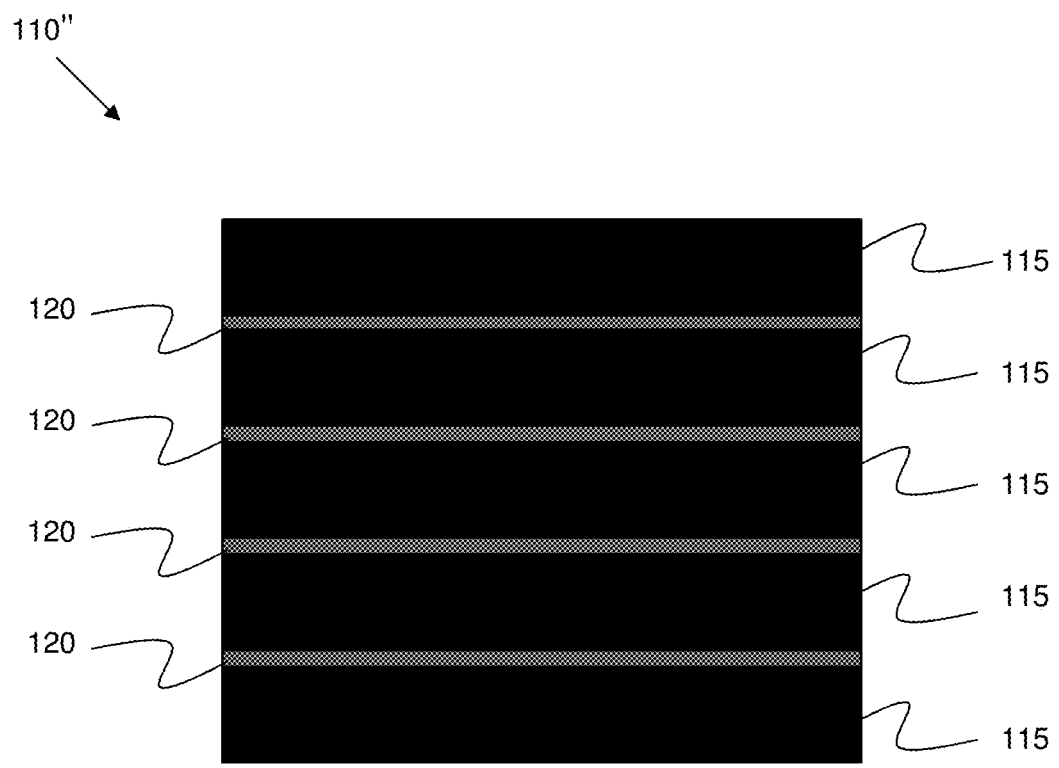

A dielectric film 110 is deposited over the metal plate 105 by conventional deposition processes, e.g., atomic layer deposition (ALD). Specifically, there is a deposition of a dielectric film 110 over the bottom plate, i.e., the metal plate 105. In embodiments, the dielectric film 110 can be, e.g., a high-k gate dielectric material, e.g., hafnium or zirconium based dielectrics. Specifically, the high-k dielectric materials can include, but are not limited to: $Al_2O_3$, $HfO_2$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. In this way, the dielectric film 110 is a high-k dielectric film. Further, the high-k dielectric film can be a hafnium based dielectric or a zirconium based dielectric. In embodiments, the dielectric film 110 can be a stack of dielectric films, as shown in FIG. 2A, or a laminated film as shown in FIG. 2B.

The dielectric film 110 undergoes a treatment process 135 to modify a surface of the dielectric film 110. Specifically, a surface of the dielectric film 110 is modified to increase the dielectric constant of the dielectric film 110, thereby increasing capacitance. In embodiments, the treatment process 135 begins with the application of a gas, followed by a curing of the dielectric film 110 provided by lamp 130. More specifically, the treatment process 135 begins by exposing the dielectric film 110 to a gas.

In embodiments, the gas can be ammonia ($NH_3$) or oxygen ($O_3$), amongst other examples. In this way, the gas is comprised of $NH_3$ or $O_3$. In embodiments, the concentration of $NH_3$ is around 10%-80%, while the concentration of $O_3$ can be around 10%-100%, for example. In further embodiments, any combination of $NH_3$ and $O_3$ is contemplated, including the use of both $NH_3$ and $O_3$. The application of the gas during the treatment process allows for the infusion of nitrogen (N) into the dielectric film 110, thereby making the dielectric film 110 denser. Annealing and N incorporation can increase the dielectric constant, resulting in an increased capacitance. In this way, the dielectric film 110 is a nitrogen infused dielectric film over the bottom plate, i.e., the metal plate 105. A subsequent top plate can be placed over this nitrogen infused dielectric film.

The curing of the dielectric film 110 occurs by ultra-violet (UV) radiation. In embodiments, the wavelength of the UV radiation is less than 400 nm, for example. In this way, the UV radiation has a wavelength less than 400 nm. Further, the length of time for the UV radiation can be in a range of about 10 seconds to 180 seconds, with a preferred length of time being in a range of about 30 seconds to 90 seconds. In this way, the UV radiation is for a time period in a range of 30 seconds to 90 seconds. In embodiments, the lamp 130 which applies the UV radiation can be a mercury (Hg) lamp, or a LED lamp, for example. In embodiments, the temperature of the UV radiation curing can be in a range of about 150° C. to a maximum of 400° C., with a preferred range of about 200° C.-350° C. In this way, the curing is by UV radiation at a temperature range of about 150° C.-400° C. In embodiments, a preferred temperature is at about 335° C. or other temperatures which will not melt the underlying metal plate 105 and/or any subsequent top metal plate placed over the dielectric film 110. Specifically, a temperature of the UV radiation is below a melting point of any subsequent top plate.

By modifying the dielectric film 110 with the treatment process 135, the dielectric film 110 is annealed with a thermal budget compatible with back end of line (BEOL) temperatures. More particularly, modifying a surface of the dielectric film 110 results in an increased dielectric constant, allowing for an increased capacitance. In this way, dielectric breakdown is prevented to reduce leakage for an MIMCAP device in high capacitance applications.

FIGS. 2A and 2B show various embodiments of the dielectric film 110. For example, FIG. 2A illustrates a dielectric film 110 as a stacked film 110'. In the stacked film 110', high-k dielectric layers 115, 120 are stacked with respect to one another. In embodiments, the high-k dielectric layers 115, 120 can be symmetrical or asymmetrical with respect to one another. For example, the high-k dielectric layers 115 can be comprised of $HfO_2$ at 43 cycles, while the high-k dielectric layer 120 can be comprised of $Al_2O_3$ at 3 cycles. This process can continue for any desired number of layers, with these three layers being shown as a non-limiting embodiment.

FIG. 2B illustrates a dielectric film 110 as a laminated film 110". In the laminated film 110", three or more high-k dielectric layers can be implemented, for example. In this way, the laminated film 110" can provide a more uniform aluminum (Al) distribution through the dielectric film 110 in comparison to the stacked film 110'. In this example, the nitrogen infused dielectric film, i.e., the dielectric film 110, is composed of laminated high-k dielectric layers 115, 120. In the laminated film 110", the high-k dielectric layers 115, 120 can be symmetrical or asymmetrical with respect to one another. For example, the high-k dielectric layers 115 can be comprised of $HfO_2$ at 9 cycles, while the high-k dielectric layers 120 can be comprised of $Al_2O_3$ at 1 cycle, for example. Other variations for laminated films in the laminated film 110" include $[H-A]_x$, $[A-H]_x$ and $[A-H-A]_x$, in which H represents $HfO_2$ and A represents $Al_2O_3$, amongst other examples.

In embodiments, the treatment process 135 can be applied to the dielectric film 110, and particularly to either the stacked film 110' or the laminated film 110", in various methods and at various steps of the process, after the completion of each deposition cycle for the high-k dielectric layers 115, 120. For example, the high-k dielectric layer 115 can be deposited by an ALD process for the stacked film 110', followed by exposure to the gas and UV radiation of the treatment process 135. The high-k dielectric layer 120 can be deposited over the high-k dielectric layer 115, followed by the deposition of the high-k dielectric layer 115 over the high-k dielectric layer 120. In this example, the process involves a deposition and treatment of a first high-k dielectric layer, followed by the deposition of second and third high-k dielectric layers which are not treated by the treatment process 135.

In further embodiments, the high-k dielectric layer 120 of the stacked film 110' can undergo the treatment process 135, while the high-k dielectric layers 115 above and below the high-k dielectric layer 120 do not undergo the treatment process 135. In this example, the high-k dielectric layer 115 is deposited by an ALD process, followed by a deposition of the high-k dielectric layer 120 over the high-k dielectric layer 115, which is then treated by the treatment process 135. Another high-k dielectric layer 115 is deposited over the now treated high-k dielectric layer 120. In this example, the process involves a deposition of the first high-k dielectric layer, followed by the deposition of a second high-k dielectric layer on the first high-k dielectric layer and which is treated, followed by the deposition of a third high-k dielectric layer over the treated second high-k dielectric layer. Specifically, a first high-k dielectric layer and a third high-k dielectric layer are not treated, but a second high-k dielectric layer is treated.

In even further embodiments, each high-k dielectric layer can be treated in either the stacked film 110' or the laminated film 110" by separately undergoing the treatment process 135. In this way, the high-k dielectric film comprises stacked high-k dielectric layers or laminated high-k dielectric layers, when after each layer of the stacked high-k dielectric layers or the laminated high-k dielectric layers is deposited, it is subjected individually to the exposing and curing. For example, the high-k dielectric layer 115 in the laminated film 110" is deposited by ALD, then treated with the treatment process 135, followed by the deposition of the high-k dielectric layer 120 by ALD, which is then treated with the treatment process 135, followed by the deposition of the high-k dielectric layer 115 by ALD over the high-k dielectric layer 120, which is then treated with the treatment process 135, etc. In this example, the process involves a deposition and treatment of each high-k dielectric layer in the dielectric film 110.

Treating every high-k dielectric layer after deposition results in a higher concentration of nitrogen infused into the dielectric film 110. Specifically, there is a deposition of a first high-k dielectric layer, i.e., the high-k dielectric layer 115, followed over a bottom plate, i.e., the metal plate 105. The first high-k dielectric layer is exposed to a $NH_3$ or $O_3$ gas and then cured with UV radiation. In embodiments, the first high-k dielectric layer is composed of hafnium or zirconium based dielectric. This is followed by the deposition of at least one additional high-k dielectric layer, i.e., the high-k dielectric layer 120, over the first high-k dielectric layer in either a stacked or laminate structure, i.e., as a stacked film 110' or as a laminated film 110". This at least one additional high-k dielectric layer is exposed to $NH_3$ or $O_3$ gas and cured by UV radiation. A top plate is then deposited over the at least one additional high-k dielectric layer, i.e., the high-k dielectric layer 120. It is also contemplated that the high-k dielectric film comprises stacked high-k dielectric layers or laminated high-k dielectric layers, and is subjected to the exposing and the curing after any layer of the stacked high-k dielectric layers or the laminated high-k dielectric layers is deposited.

Figure 3:
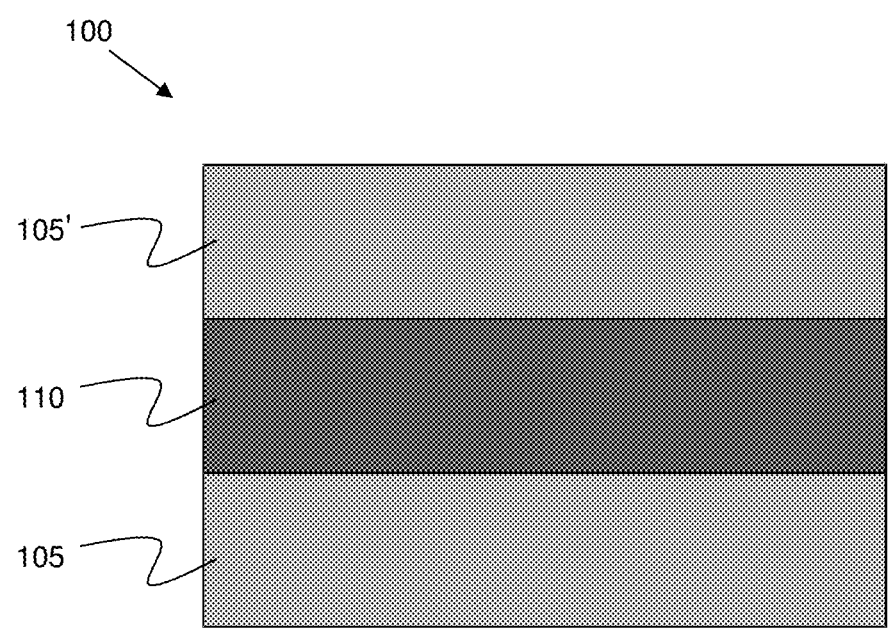
FIG. 3 shows a capacitor structure, amongst other features, and respective fabrication processes in accordance with aspects of the present disclosure.

FIG. 3 shows a metal plate 105' over the dielectric film 110, which acts as a top plate for the MIMCAP device 100. Specifically, there is a deposition of a top plate, i.e., the metal plate 105', over the dielectric film 110. The metal plate 105' can be deposited by conventional deposition processes, e.g., CVD or PVD, for example. In embodiments, the metal plate 105' can be composed of any suitable conductive metal, e.g., TiN, amongst other examples. In this way, both the bottom plate, i.e., the metal plate 105, and the top plate, i.e., the metal plate 105', are conductive materials. Specifically, both the bottom plate, i.e., the metal plate 105, and the top plate, i.e., the metal plate 105', are composed of TiN.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   depositing a bottom plate;
   depositing a dielectric film directly on the bottom plate;
   modifying a surface of the dielectric film to increase a dielectric constant of its surface;
   depositing a second dielectric film on the modified dielectric film and which is comprised of a same material as the dielectric film and with a lower dielectric constant than the modified dielectric film; and
   depositing a top plate over the second dielectric film, wherein:
   the bottom plate and the top plate are composed of TiN,
   the modifying the surface of the dielectric film comprises exposing the dielectric film to a gas and curing the dielectric film, the modified dielectric film and the second dielectric film are comprised of a high-k dielectric film,
   the high-k dielectric film is a zirconium based dielectric, and
   the dielectric film comprises laminated high-k dielectric layers, when after each layer of the laminated high-k dielectric layers is deposited it is subjected individually to the exposing and curing, prior to the deposition of the second film.

2. The method of claim 1, wherein the zirconium based dielectric is $ZrO_2$.

3. The method of claim 1, wherein the modified dielectric film and the second dielectric film are a stack of high-k dielectric layers, the modified dielectric film has a different dielectric constant than the second dielectric film.

4. The method of claim 1, wherein the-dielectric film comprises stacked high-k dielectric layers, and is subjected to the exposing and the curing after each layer of the stacked high-k dielectric layers is deposited, prior to the deposition of the second film.

5. The method of claim 1, wherein the the second dielectric film and the dielectric are deposited in different deposition cycles and result in an asymmetrical stack of dielectric materials.

6. The method of claim 5, wherein the gas is comprised of $NH_3$ or $O_3$.

7. The method of claim 5, wherein the curing is by UV radiation at a temperature range of about 150° C.-400° C.

8. The method of claim 7, wherein the UV radiation has a wavelength less than 400 nm.

9. The method of claim 8, wherein the UV radiation is for a time period in a range of 30 seconds to 90 seconds.

10. A method comprising:
    depositing a first high-k dielectric layer directly on a bottom plate;
    modifying a surface of the first high-k dielectric layer to increase a dielectric constant of the first high-k dielectric layer by:
    exposing the first high-k dielectric layer to a $NH_3$ or $O_3$ gas; and
    curing the first high-k dielectric layer with UV radiation;
    depositing at least one additional high-k dielectric layer having a dielectric constant lower than the first high-k dielectric layer over the first high-k dielectric layer in either a stacked or laminate structure, the at least one additional high-k dielectric layer being comprised of a same material as the first high-k dielectric layer;
    depositing a top plate over the least one additional high-k dielectric layer, wherein the at least one additional high-k dielectric layer is comprised of a material having a greater amount of cycles than the first high-k dielectric layer, wherein:
    the bottom plate and the top plate are composed of TiN,
    the first high-k dielectric layer is a zirconium based dielectric, and
    the at least one additional high-k dielectric layer comprises laminated high-k dielectric layers, when after each layer of the laminated high-k dielectric layers is deposited it is subjected individually to the exposing and curing.

11. The method of claim 10, further comprising exposing the at least one additional high-k dielectric layer to $NH_3$ or $O_3$ gas and UV radiation to modify a surface of the at least one additional high-k dielectric layer to increase a dielectric constant of the at least one additional high-k dielectric layer.

12. The method of claim 10, wherein a temperature of the UV radiation is below a melting point of the top plate.

13. A structure comprising:
a bottom plate;
an asymmetrical nitrogen infused dielectric film comprising a plurality of different species over the bottom plate, the asymmetrical nitrogen infused dielectric film comprises a treated dielectric layer between untreated dielectric layers, the treated dielectric layer and the untreated dielectric layers being comprised of a same material, the treated dielectric layer having a modified upper surface annealed with a thermal budget compatible with back end of line (BEOL) temperatures to reduce leakage and a higher dielectric constant than the untreated dielectric layers; and
a top plate over the nitrogen infused dielectric film, wherein:
the bottom plate and the top plate are composed of TiN,
the treated dielectric layer is a zirconium based dielectric, and
the treated dielectric layer comprises laminated high-k dielectric layers which are below and above the untreated dielectric layers.

14. The structure of claim 13, wherein the treated dielectric layer and the untreated dielectric layers are configured as laminated high-k dielectric layers.

* * * * *